(12) United States Patent  
Tanaka

(10) Patent No.: US 7,515,277 B2  
(45) Date of Patent: Apr. 7, 2009

(54) STAGE APPARATUS, CONTROL SYSTEM, EXPOSURE APPARATUS, AND DEVICE MANUFACTURING METHOD

(75) Inventor: Takatoshi Tanaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/954,382

(22) Filed: Dec. 12, 2007

(65) Prior Publication Data

US 2008/0144042 A1    Jun. 19, 2008

(30) Foreign Application Priority Data

Dec. 14, 2006    (JP) .............................. 2006-337579

(51) Int. Cl.  
*G01B 11/02*    (2006.01)

(52) U.S. Cl. ..................................... 356/500

(58) Field of Classification Search ................. 356/500, 356/498, 496  
See application file for complete search history.

(56) References Cited

U.S. PATENT DOCUMENTS 5,141,318 A * 8/1992 Miyazaki et al. ............ 356/500  
5,483,343 A * 1/1996 Iwamoto et al. ............. 356/484  
5,870,198 A * 2/1999 Takagi ........................ 356/500  
2007/0090301 A1* 4/2007 Van Empel et al. ......... 250/428  
2008/0285051 A1* 11/2008 Hill ............................ 356/500

FOREIGN PATENT DOCUMENTS

JP    2000-331904    11/2000

* cited by examiner

*Primary Examiner*—Tarifur Chowdhury  
*Assistant Examiner*—Jonathan M Hansen  
(74) *Attorney, Agent, or Firm*—Locke Lord Bissell & Liddell LLP

(57) ABSTRACT

A stage apparatus includes X- and Y-axis laser interferometers each of which measures the position a stage, a wavelength compensator which compensates for the wavelength change of a laser beam from each of the X- and Y-axis laser interferometers, a fan duct which is connected to a thermoregulator for supplying a temperature-controlled gas and supplies the temperature-controlled gas to the optical axes of the X- and Y-axis laser interferometers, and a fan duct which is connected to the thermoregulator and supplies the temperature-controlled gas to the wavelength compensator. The time necessary for supplying the temperature-controlled gas from the thermoregulator to the optical axes of the X- and Y-axis laser interferometers through the fan duct is equal to the time necessary for supplying the temperature-controlled gas from the thermoregulator to the wavelength compensator through the fan duct.

9 Claims, 6 Drawing Sheets

STAGE APPARATUS, CONTROL SYSTEM, EXPOSURE APPARATUS, AND DEVICE MANUFACTURING METHOD

BACKGROUND OF THE INVENTION

1. Field of the Invention

The present invention relates to a stage apparatus, control system, exposure apparatus, and device manufacturing method and, more particularly, to a technique using a laser interferometer.

2. Description of the Related Art

Conventionally, a laser interferometer having a helium-neon (He—Ne) laser as a light source is used to measure the coordinates of a moving member such as a stage. The laser interferometer capable of accurate measurement is suitable for accurate control of a moving member. The optical path wavelength of a laser beam emitted from the laser interferometer can change depending on the refractive index of the atmosphere (gas). For this reason, it is necessary to compensate for the change in the optical path wavelength of the laser beam.

Japanese Patent Laid-Open No. 2000-331904 discloses wavelength compensators for executing such compensation, including a compensator that calculates a wavelength change amount indirectly by detecting the atmospheric pressure, temperature, or humidity by a sensor and a compensator that directly detects a wavelength change amount by separately preparing a dedicated interferometer.

However, it is generally difficult to install a wavelength compensator near the optical path of a laser interferometer (to be referred to as a "moving member measuring interferometer" hereinafter) to measure the coordinates of a moving member. For this reason, the wavelength compensator is located in a place different from the moving member measuring interferometer. When the wavelength compensator is located in a place different from the moving member measuring interferometer, a conditioner for the wavelength compensator is also often installed separately from that for the moving member measuring interferometer, and the conditioning environments may be different. This generates an error in the wavelength compensator and degrades the measurement accuracy of the moving member measuring interferometer.

A gas conditioned by a conditioner can change its temperature, atmospheric pressure, humidity, and the like periodically as the time elapses. Such a periodical change is very small and hard to eliminate using a compensator in a control system. If the temperature, atmospheric pressure, humidity, and the like of the gas change, the refractive index of the gas can change and vary the optical path wavelength of a laser beam of the moving member measuring interferometer. This degrades the measurement accuracy of the moving member measuring interferometer.

SUMMARY OF THE INVENTION

The present invention has been made in consideration of the above-described problems, and has as its object to improve the measurement accuracy of a laser interferometer to measure the position of a stage.

According to the first aspect of the present invention, there is provided a stage apparatus comprising a laser interferometer which measures a position of a stage, a wavelength compensator which compensates for a wavelength change of a laser beam from the laser interferometer, a first duct which is connected to a conditioner for supplying a temperature-controlled gas and supplies the temperature-controlled gas to an optical axis of the laser interferometer, and a second duct which is connected to the conditioner and supplies the temperature-controlled gas to the wavelength compensator, wherein a time necessary for supplying the temperature-controlled gas from the conditioner to the optical axis of the laser interferometer through the first duct is equal to a time necessary for supplying the temperature-controlled gas from the conditioner to the wavelength compensator through the second duct.

According to the second aspect of the present invention, there is provided a control system comprising the above-described stage apparatus, and a control apparatus which controls the stage apparatus based on outputs from the laser interferometer and the wavelength compensator.

According to the third aspect of the present invention, there is provided an exposure apparatus comprising an optical system which projects a pattern of an original plate to a substrate, and the above-described control system which holds and positions one of the substrate and the original plate on a stage.

According to the fourth aspect of the present invention, there is provided a device manufacturing method comprising the steps of causing the above-described exposure apparatus to manufacture a substrate having a latent image pattern, and developing the latent image pattern.

Further features of the present invention will become apparent from the following description of exemplary embodiments (with reference to the attached drawings).

DESCRIPTION OF THE EMBODIMENTS

First Embodiment

A preferred embodiment of the present invention will be described below in detail with reference to the accompanying drawings.

Figure 1:
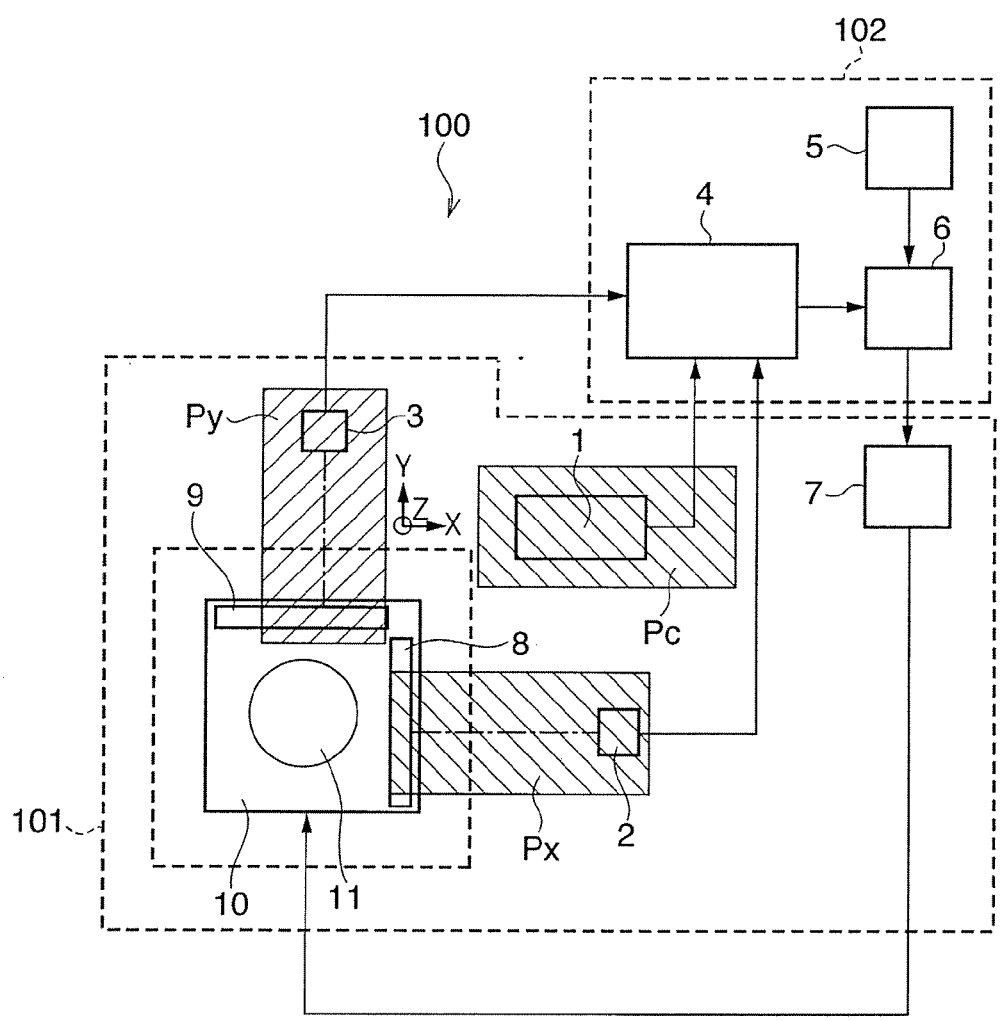
FIG. 1 is a block diagram schematically showing a control system according to a preferred embodiment of the present invention.

FIG. 1 is a block diagram schematically showing a control system according to a preferred embodiment of the present invention. A control system 100 comprises a stage apparatus 101 which drives and positions a stage 10 with a substrate 11 such as a wafer and executes an exposure process, and a control apparatus 102 which controls the stage apparatus 101. The stage apparatus 101 includes the stage 10, an X-axis laser interferometer 2, Y-axis laser interferometer 3, current amplifier 7, and wavelength compensator 1. The control apparatus 102 includes a stage position measuring device 4, CPU 5, and stage controller 6.

The X-axis laser interferometer 2 for X-axis measurement and the Y-axis laser interferometer 3 for Y-axis measurement measure the position of the stage 10. The X-axis laser interferometer 2 emits a laser beam toward a mirror 8 and measures the reflected laser beam. The Y-axis laser interferometer 3 emits a laser beam toward a mirror 9 and measures the reflected laser beam. The wavelength compensator 1 measures the wavelength change in the atmosphere (gas) through which the laser beams from the X-axis laser interferometer 2 and Y-axis laser interferometer 3 pass. The wavelength compensator 1 may include a compensation laser interferometer for directly measuring the wavelength change in the atmosphere. Alternatively, the wavelength compensator 1 may have a sensor for measuring the temperature, atmospheric pressure, humidity, or the like of the atmosphere and calculate the wavelength change in the atmosphere based on the measurement result. The stage position measuring device 4 compensates for the wavelength of the atmosphere based on the output from the wavelength compensator 1 and outputs the result to the stage controller 6. The stage controller 6 outputs a driving instruction of the current amplifier 7 based on the compensation result of the stage position measuring device 4. Upon receiving the driving instruction from the stage controller 6, the current amplifier 7 supplies a corresponding current to the driving unit (not shown) of the stage 10, thereby driving the stage 10 to a position corresponding to the driving instruction. The CPU 5 controls the entire control system.

Figure 2:
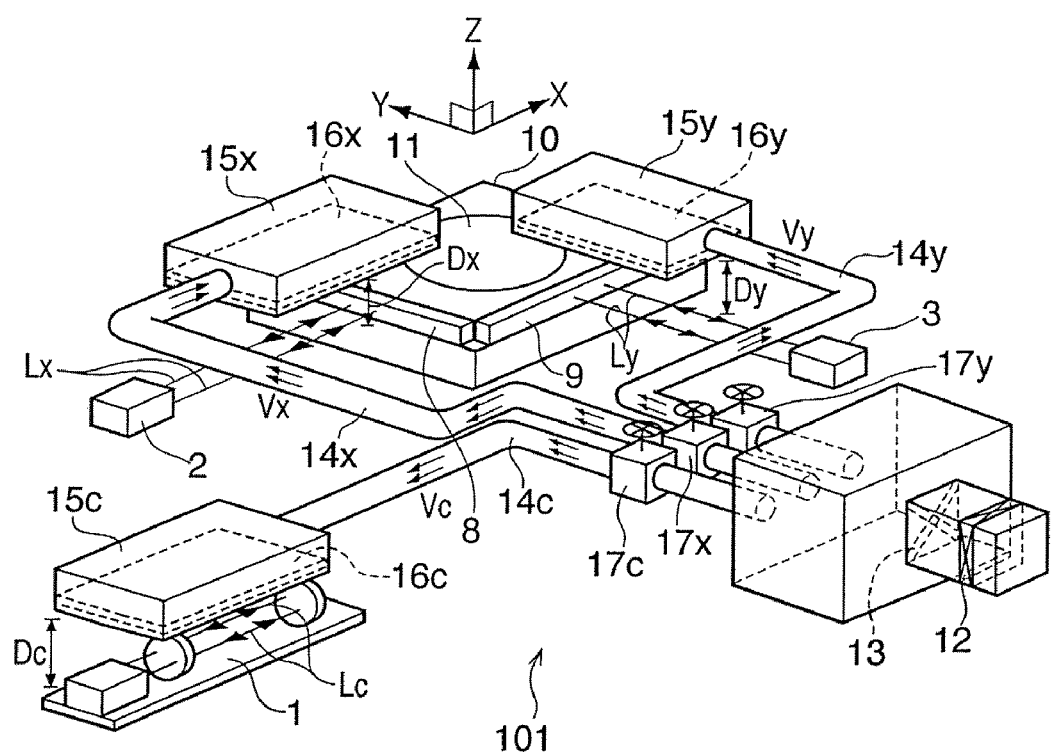
FIG. 2 is a perspective view schematically showing the arrangement of conditioning arranged in a stage apparatus shown in FIG. 1.

Conditioning outlets to blow an accurately conditioned gas (e.g., air) are arranged above an area Px near the X-axis laser interferometer 2, an area Py near the Y-axis laser interferometer 3, and an area Pc near the wavelength compensator 1, as shown in FIG. 2.

FIG. 2 is a perspective view schematically showing the arrangement of conditioning arranged in the stage apparatus 101 shown in FIG. 1. A blower 13 supplies a gas whose temperature is controlled by a thermoregulator 12 to the vicinity of the X-axis laser interferometer 2, Y-axis laser interferometer 3, and wavelength compensator 1 through fan ducts 14$x$, 14$y$, and 14$c$. The fan duct 14$x$ is connected to an atmospheric pressure chamber 15$x$ arranged above the area Px in FIG. 1 and designed to guide the gas with the temperature controlled by the thermoregulator 12 to the area Px. The fan duct 14$y$ is connected to an atmospheric pressure chamber 15$y$ arranged above the area Py in FIG. 1 and designed to guide the gas with the temperature controlled by the thermoregulator 12 to the area Py. The fan duct 14$c$ is connected to an atmospheric pressure chamber 15$c$ arranged above the area Pc in FIG. 1 and designed to guide the gas with the temperature controlled by the thermoregulator 12 to the area Pc. The conditioning outlets of the atmospheric pressure chambers 15$x$, 15$y$, and 15$c$ are preferably formed from stream dividing members 16$x$, 16$y$, and 16$c$ which have a large thermal capacity and aim at suppressing the temperature variation in conditioning or filters 20$x$, 20$y$, and 20$c$ with a straightening effect for straightening the stream. A laminar flow of the gas blows from the conditioning outlets formed from the filters 20$x$, 20$y$, and 20$c$ to the wavelength compensator 1 and the optical axes of the X-axis laser interferometer 2 and Y-axis laser interferometer 3.

In this embodiment, flow rate is adjusted such that the gas with the temperature controlled by the thermoregulator 12 is guided from the thermoregulator 12 to the X-axis laser interferometer 2, Y-axis laser interferometer 3, and wavelength compensator 1 in the same time. More specifically, a valve 17$x$ is provided on the fan duct 14$x$ to adjust a flow rate Vx. Let lx be the distance from the thermoregulator 12 to the conditioning outlet of the atmospheric pressure chamber 15$x$. A time tx necessary for the gas with the temperature controlled by the thermoregulator 12 to reach the X-axis laser interferometer 2 is adjusted to lx/Vx. A valve 17$y$ is provided on the fan duct 14$y$ to adjust a flow rate Vy. Let ly be the distance from the thermoregulator 12 to the conditioning outlet of the atmospheric pressure chamber 15$y$. A time ty necessary for the gas with the temperature controlled by the thermoregulator 12 to reach the Y-axis laser interferometer 3 is adjusted to ly/Vy. A valve 17$c$ is provided on the fan duct 14$c$ to adjust a flow rate Vc. Let lc be the distance from the thermoregulator 12 to the conditioning outlet of the atmospheric pressure chamber 15$c$. A time tc necessary for the gas with the temperature controlled by the thermoregulator 12 to reach the wavelength compensator 1 is adjusted to lc/Vc.

As described above, according to this embodiment, it is possible to adjust the times tx, ty, and tc to guide the gas with the temperature controlled by the thermoregulator 12 from there to the X-axis laser interferometer 2, Y-axis laser interferometer 3, and wavelength compensator 1 to almost the same time by adjusting the flow rate Vx, Vy, and Vc of the gas with the temperature controlled by the thermoregulator 12. This unifies the temporal changes in the refractive index of the gas on the wavelength compensator 1 and the optical axes of the X-axis laser interferometer 2 and Y-axis laser interferometer 3 caused by the periodical temperature variation of the thermoregulator 12.

The wavelength compensator 1 is generally to directly detect the amount of change in wavelength in combination with a compensation laser interferometer. However, the wavelength compensator 1 may be designed to indirectly detect the amount of change in wavelength in combination with a temperature sensor, humidity sensor, or atmospheric pressure sensor.

The above-described times tx, ty, and tc need not always be adjusted by the valves 17$x$, 17$y$, and 17$c$. The diameters or sectional shapes of the ducts almost determine the flow rate (gas flow velocities) Vx, Vy, and Vc in the ducts. The lengths of the fan ducts 14$x$, 14$y$, and 14$c$ or the lengths of the conditioning outlets may be adjusted based on the gas flow velocities such that the times tx, ty, and tc become equal. For example, when a fan duct has a small diameter, the pressure loss increases, and the gas flow velocity in the fan duct decreases. In this case, the fan duct should be short. Conversely, when a fan duct has a large diameter, the fan duct should be long.

In this embodiment, a thermoregulator is used as a conditioner. However, the present invention is not limited to this, and any other device such as a humidity controller, atmospheric pressure controller, or fan is usable if it can generate a temporal change in the gas state. That is, in this embodiment, the conditioner includes arbitrary devices for temporarily changing the gas state. It is only necessary to unify the times required for the gas to reach from one of the conditioners, which has the largest influence, to the wavelength compensator and the optical axes of the moving member measuring interferometers.

Second Embodiment

Figure 3:
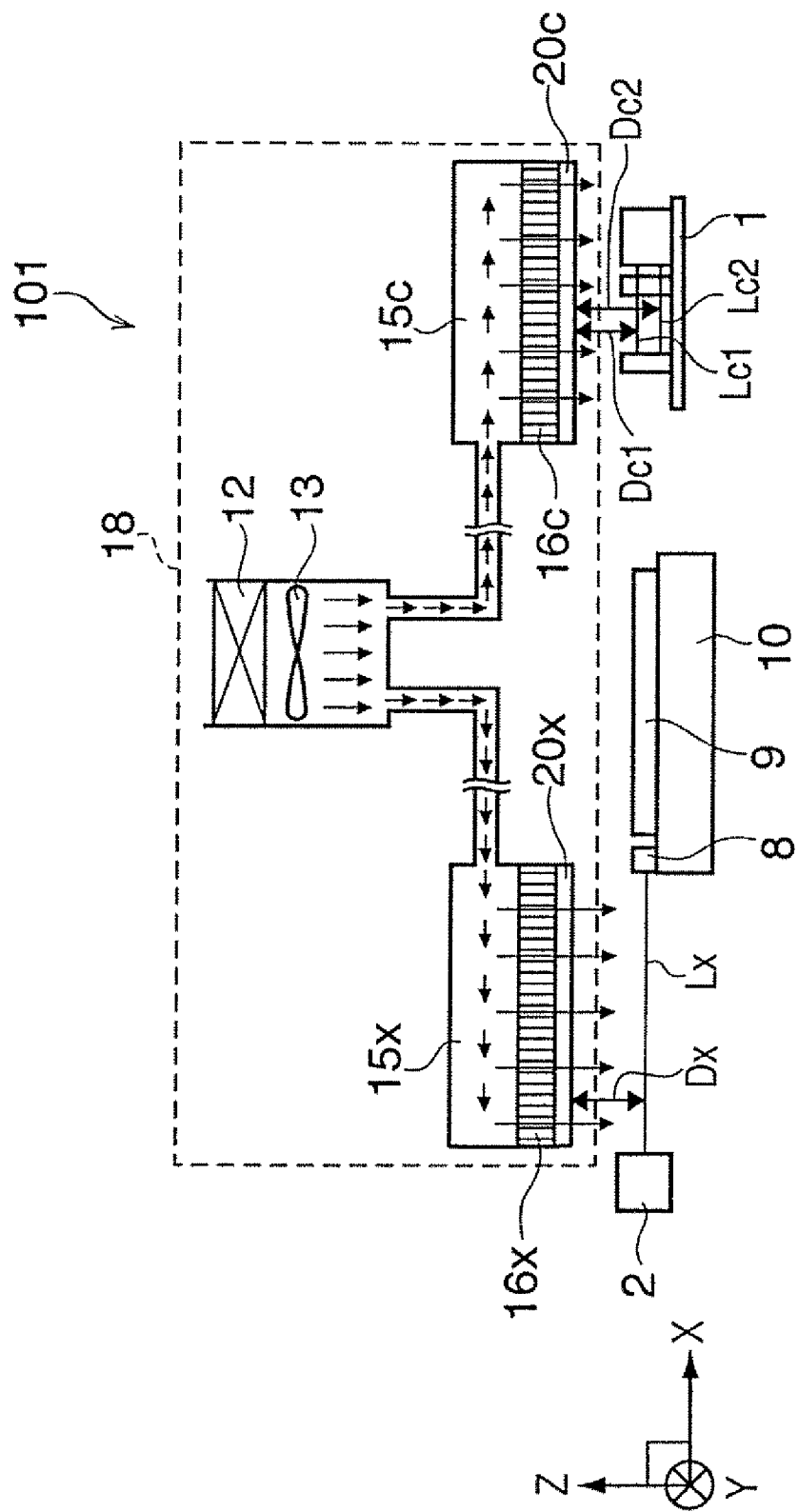
FIG. 3 is a sectional view schematically showing an arrangement of a stage apparatus according to the second preferred embodiment of the present invention.

FIG. 3 is a sectional view schematically showing an arrangement of a stage apparatus according to the second preferred embodiment of the present invention. In this embodiment, a distance (interval) Dx (Dy is not shown) from a filter 20$x$ (20$y$ is not shown) of a conditioning outlet to an optical axis Lx (Ly is not shown) of an interferometer and a distance (Dc1 or Dc2) to a wavelength compensator 1 are almost unified. The gas near the outlet may generate very vortices which cause a temporal pressure variation or temperature variation. Hence, the outlet has the same function as the conditioner of the first embodiment. In the second embodiment, assuming that the gas state variable factor by the outlet is large, the distances from the outlets to the optical axes (Lx and Ly) of the interferometers and the wavelength compensator 1 are unified.

For example, assume that the compensation laser interferometer of the wavelength compensator 1 has a plurality of optical axes. Let $D_{c1}$ and $D_{c2}$ be the distances from the conditioning outlets to optical axes Lc1 and Lc2 of the wavelength compensator. In this case, it is necessary that distances $D_x$ and $D_y$ from the conditioning outlets to the optical axes of the X-axis laser interferometer and Y-axis laser interferometer satisfy $$D_{c1} \leq D_x \leq D_{c2} \qquad (1)$$

$$D_{c1} \leq D_y \leq D_{c2} \qquad (2)$$

This arrangement improves the measurement accuracy of the moving member measuring interferometers.

In this embodiment, conditioning to satisfy the above-described relationships is provided around the optical axes of the interferometers for measuring the X- and Y-axis positions of the stage. It is preferable to provide the same conditioning even around the optical axis of an interferometer for measuring the Z-direction position of the stage.

As described above, according to this embodiment, it is possible to almost unify the temporal changes in the refractive index mainly caused by atmospheric pressure variations in the gas on the wavelength compensator 1 and the optical axes Lx and Ly of the interferometers. Hence, accurate wavelength compensation of the laser interferometers can be done.

Figure 4:
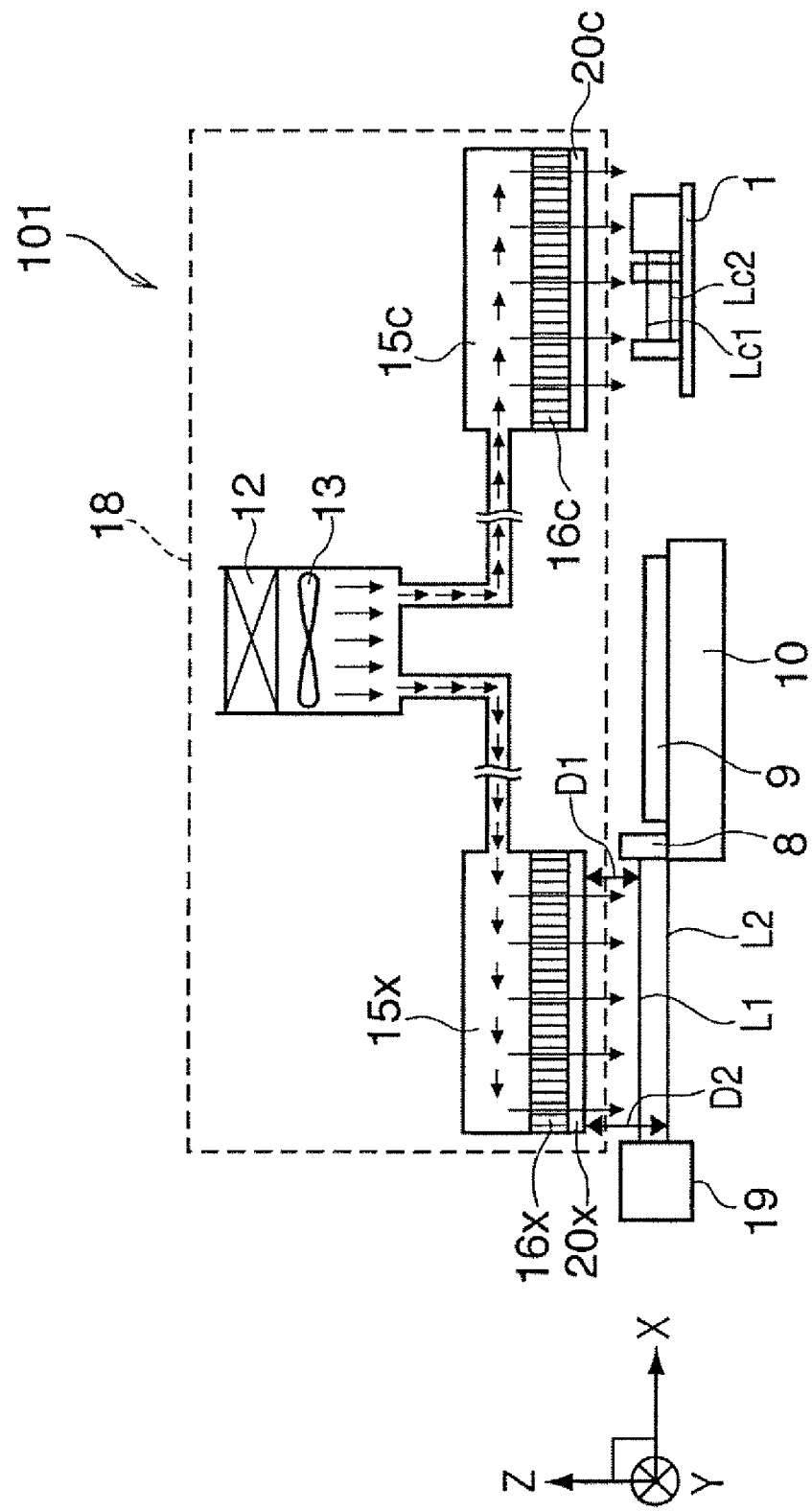
FIG. 4 is a sectional view schematically showing another arrangement of the stage apparatus according to the second preferred embodiment of the present invention.

As shown in FIG. 4, a triaxial interferometer 19 having a plurality of optical axes measures rotation in the θ direction or Tilt direction. In this case, it is difficult to unify the distances from the conditioning outlets to all optical axes. Let $D_c$ be the average value of the distances from the conditioning outlets to the optical axes Lc1 and Lc2 of the compensation laser interferometer of the wavelength compensator 1, and $D_1$ and $D_2$ be the distances from the conditioning outlet to optical axes L1 and L2 of the triaxial interferometer 19. In this case, it is only necessary to satisfy $$D_1 \leq D_c \leq D_2 \qquad (3)$$

This arrangement improves the measurement accuracy of the moving member measuring interferometers.

The conditioning outlets are preferably formed from stream dividing members 16x and 16c which have a large thermal capacity and aim at suppressing the temperature variation in conditioning or the filters 20x and 20c with a straightening effect for straightening the stream. In the present invention, the distances from the members included in the outlets to the wavelength compensator and the optical axes of the interferometers are almost unified, thereby unifying the refractive index variations on the wavelength compensator and the optical axes of the interferometers, which apparently occur mainly due to an atmospheric pressure variation.

As in the first embodiment, the wavelength compensator 1 need not always use an interferometer and may include a temperature, humidity, or atmospheric pressure sensor.

Third Embodiment

Figure 5:
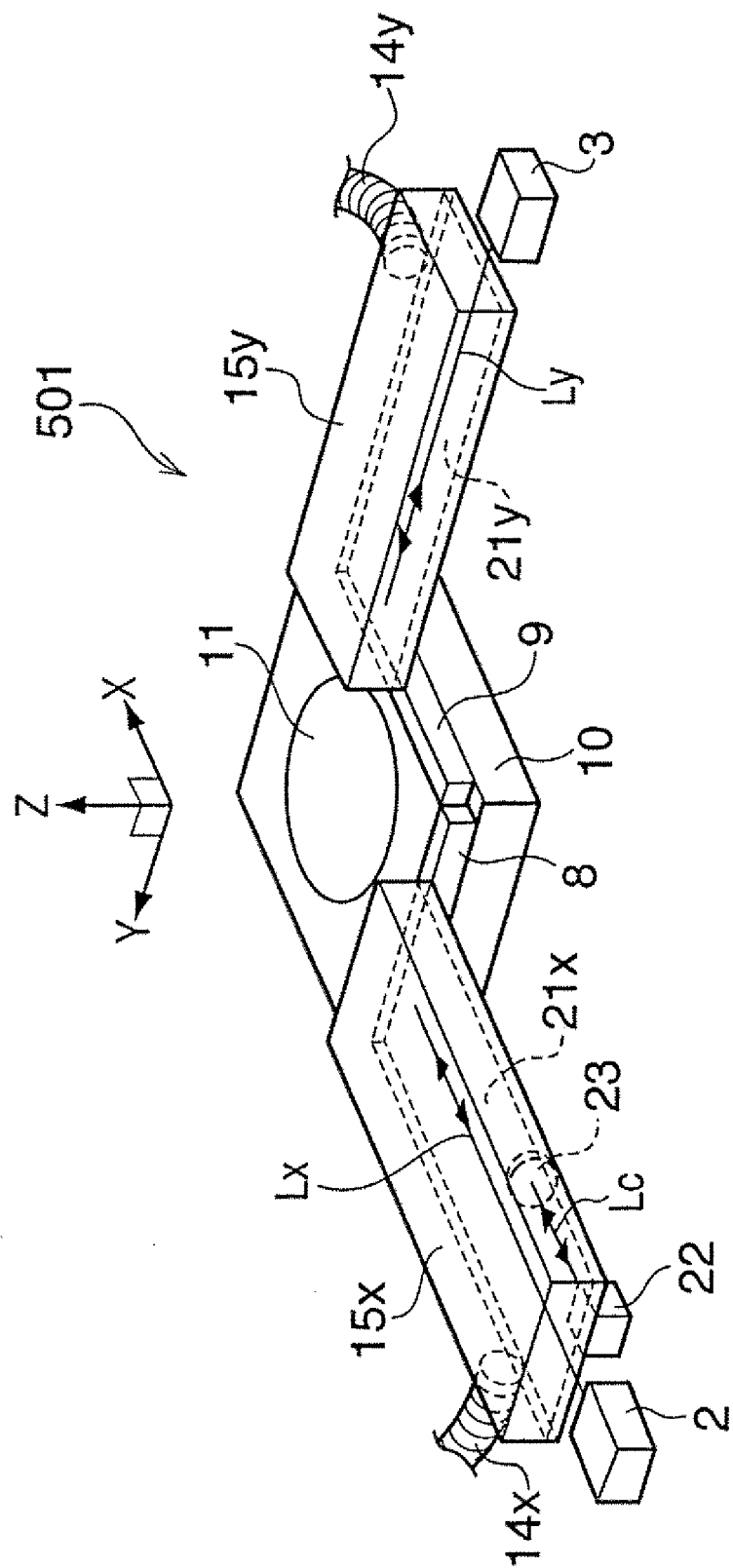
FIG. 5 is a perspective view schematically showing the arrangement of a stage apparatus according to the third preferred embodiment of the present invention.

FIG. 5 is a perspective view schematically showing the arrangement of a stage apparatus according to the third preferred embodiment of the present invention. In this embodiment, a member 21x included in the outlet for conditioning around an optical axis Lx of an X-axis laser interferometer 2 supports a compensation laser interferometer 22 and mirror 23 of a wavelength compensator. This arrangement allows omission of space necessary for conditioning of a wavelength compensator 1 and accurately compensate for a wavelength variation.

The conditioning outlet of this embodiment includes an stream dividing member having a large thermal capacity or a filter having a straightening effect, and a member for supporting/fixing the stream dividing member or filter.

In this embodiment, the member 21x in the X-axis direction supports the compensation laser interferometer 22 and mirror 23 of the wavelength compensator 1. They may be supported by a member arranged at an outlet of conditioning for an interferometer to measure the Y- or Z-axis position or rotation.

In this embodiment, the optical axis of the X-axis laser interferometer 2 is almost parallel to that of the compensation laser interferometer 22 of the wavelength compensator. The optical axes may be perpendicular to each other. This reduces interference between the X-axis laser interferometer 2 and the compensation laser interferometer 22 of the wavelength compensator. This also shortens an atmospheric pressure chamber 15x in the X direction and saves space.

As described above, according to the present invention, it is possible to accurately perform wavelength compensation by the wavelength compensator by unifying the times required to guide the gas with the temperature controlled by the thermoregulator from there to the laser interferometers and wavelength compensator. In the first to third embodiments, the stage apparatus includes one stage. However, the present invention is not limited to this and is also applicable to a stage apparatus including, for example, two stages such as twin stages. In this case, the wavelength variation can accurately be compensated by unifying times necessary for the gas from the thermoregulator to reach compensators provided on the two stages. In the present invention, "same time" indicates not only "completely same time" but also "almost same time." For example, when the distance from the thermoregulator to an optical axis shifts, as in the second embodiment, the shift is much smaller than the change over time in the gas supplied from the thermoregulator and almost negligible. A case wherein the distance from the thermoregulator to an optical axis shifts due to a design error is also incorporated in the present invention without departing from the spirit and scope of the invention.

The control system according to the preferred embodiment of the present invention is applicable to an exposure apparatus used for a semiconductor device manufacturing process. The exposure apparatus mainly includes an illumination optical system for projecting the pattern of an original plate to a substrate, and the control system according to the preferred embodiment of the present invention. Light emitted from the illumination optical system irradiates a reticle as the original plate. The reticle is held on a reticle stage. The pattern of the reticle is reduced at the magnification of a reduction projecting lens and projected. The surface of the substrate as the exposure target sample has a resist and an array of shots formed by an exposure process. As shown in FIG. 1, the substrate 11 as the exposure target is placed on the stage 10. The stage 10 includes a chuck for fixing the substrate 11, and an X-Y stage serving as a driving device horizontally movable in the X- and Y-axis directions. The X-axis laser interferometer 2 and Y-axis laser interferometer 3 measure the position information of the stage 10 based on light reflected by the mirrors 8 and 9 fixed on the stage 10.

[Application Example]

Figure 6:
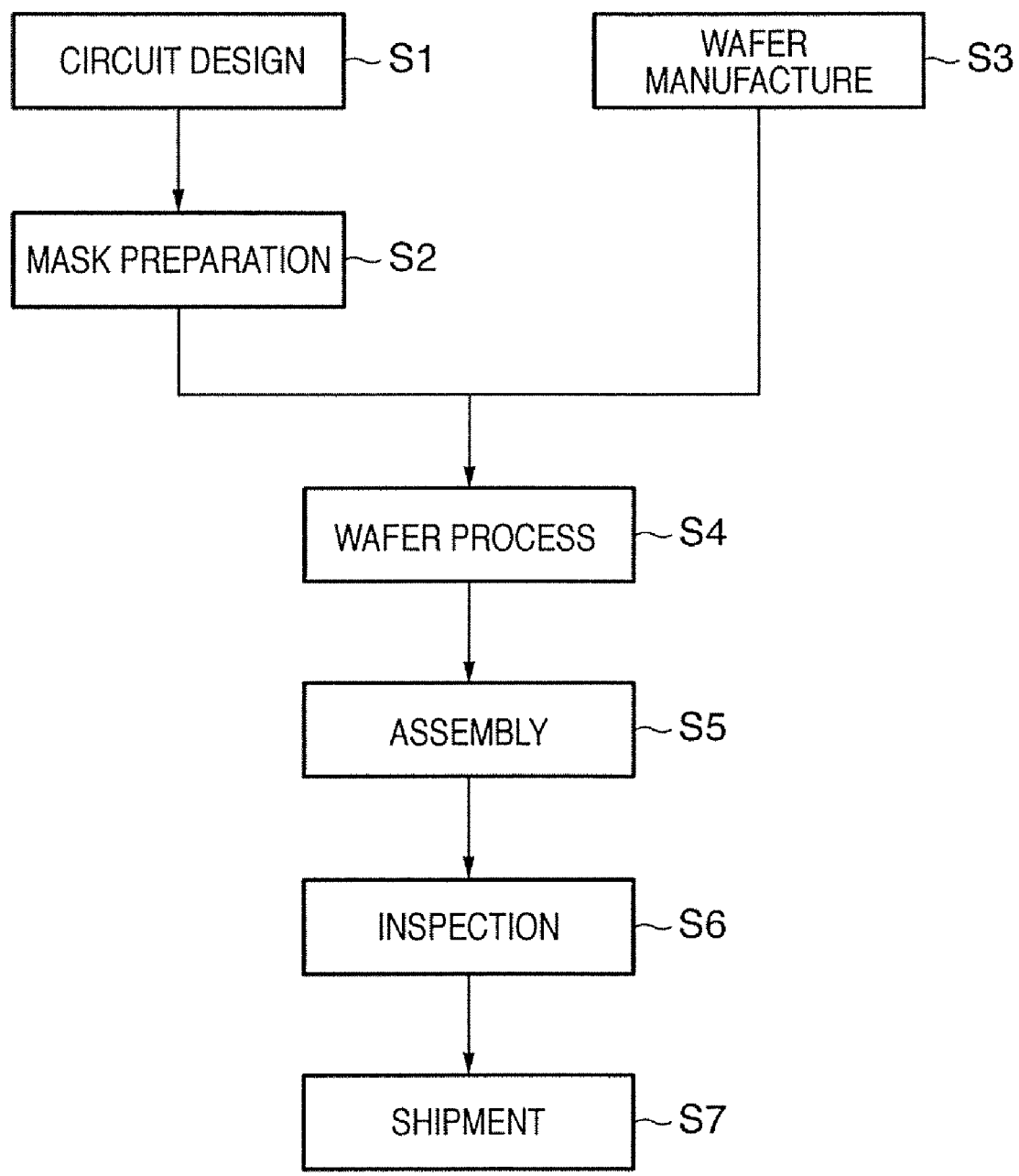
FIG. 6 is a flowchart illustrating the flow of an overall semiconductor device manufacturing process.

A semiconductor device manufacturing process using an exposure apparatus according to a preferred embodiment of the present invention will be described next. FIG. 6 is a flowchart illustrating the flow of the overall semiconductor device manufacturing process. In step S1 (circuit design), the circuit of a semiconductor device is designed. In step S2 (mask preparation), a mask (also called an original plate or reticle) is prepared based on the designed circuit pattern. In step S3 (wafer manufacture), a wafer (also called a substrate) is manufactured using a material such as silicon. In step S4 (wafer process) called a preprocess, the above-described exposure apparatus forms an actual circuit on the wafer by lithography using the mask and wafer. In step S5 (assembly) called a post-process, a semiconductor chip is formed from the wafer prepared in step S4. This step includes processes such as assembly (dicing and bonding) and packaging (chip encapsulation). In step S6 (inspection), inspections including operation check test and durability test of the semiconductor device manufactured in step S5 are performed. A semiconductor device is completed with these processes and shipped in step S7.

The wafer process in step S4 includes the following an oxidation step of oxidizing the surface of the wafer, a CVD step of forming an insulating film on the wafer surface, an electrode formation step of forming an electrode on the wafer by deposition, and an ion implantation step of implanting ions into the wafer. The wafer process also includes a resist process step of applying a photosensitizer to the wafer, an exposure step of causing the above-described exposure apparatus to expose the wafer after the resist process step through the mask pattern, thereby forming a latent image pattern on the resist, and a development step of developing the wafer exposed in the exposure step. The wafer process also includes an etching step of etching portions other than the latent image pattern developed in the development step, and a resist removal step of removing any unnecessary resist remaining after etching. By repeating these steps, multilayered circuit patterns are formed on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-337579, filed Dec. 14, 2006, which is hereby incorporated by reference herein in its entirety.

What is claimed is:

1. A stage apparatus comprising:
a laser interferometer which measures a position of a stage;
a wavelength compensator which compensates for a wavelength change of a laser beam from said laser interferometer;
a first duct which is connected to
a conditioner for supplying a temperature-controlled gas and supplies the temperature-controlled gas to an optical axis of said laser interferometer; and
a second duct which is connected to the conditioner and supplies the temperature-controlled gas to said wavelength compensator,
wherein a time necessary for supplying the temperature-controlled gas from the conditioner to the optical axis of said laser interferometer through said first duct is equal to a time necessary for supplying the temperature-controlled gas from the conditioner to said wavelength compensator through said second duct.

2. The apparatus according to claim 1, wherein
a first adjusting valve for adjusting a flow rate of the temperature-controlled gas is arranged on said first duct, and
a second adjusting valve for adjusting a flow rate of the temperature-controlled gas is arranged on said second duct.

3. The apparatus according to claim 1, wherein
the flow rate of the temperature-controlled gas passing through said first duct is equal to the flow rate of the temperature-controlled gas passing through said second duct, and
said first duct and said second duct have the same length.

4. The apparatus according to claim 1, wherein
a first atmospheric pressure chamber is connected to an outlet of said first duct,
a second atmospheric pressure chamber is connected to an outlet of said second duct, and
an interval between the first atmospheric pressure chamber and the optical axis of said laser interferometer is the same as an interval between the second atmospheric pressure chamber and said wavelength compensator.

5. The apparatus according to claim 4, wherein
said wavelength compensator comprises a compensation laser interferometer to compensate for the wavelength change, and
the interval between the first atmospheric pressure chamber and the optical axis of said laser interferometer is equal to an interval between the second atmospheric pressure chamber and an optical axis of said compensation laser interferometer.

6. The apparatus according to claim 5, wherein said compensation laser interferometer is arranged near one of the first atmospheric pressure chamber and the second atmospheric pressure chamber.

7. A control system comprising:
a stage apparatus of claim 1; and
a control apparatus which controls the stage apparatus based on outputs from said laser interferometer and said wavelength compensator.

8. An exposure apparatus comprising:
an optical system which projects a pattern of an original plate to a substrate; and
a control system of claim 7, which holds and positions one of the substrate and the original plate on a stage.

9. A device manufacturing method comprising the steps of:
causing an exposure apparatus of claim 8 to manufacture a substrate having a latent image pattern; and
developing the latent image pattern.

* * * * *